United States Patent
Kasukabe et al.

[11] Patent Number: 5,191,708
[45] Date of Patent: Mar. 9, 1993

[54] MANUFACTURING METHOD OF A PROBE HEAD FOR SEMICONDUCTOR LSI INSPECTION APPARATUS

[75] Inventors: Susumu Kasukabe, Yokohama; Ryuichi Takagi, Tokyo, both of Japan

[73] Assignee: Hitachi, Ltd., Tokyo, Japan

[21] Appl. No.: 711,864

[22] Filed: Jun. 7, 1991

[30] Foreign Application Priority Data

Jun. 20, 1990 [JP] Japan ................... 2-159734

[51] Int. Cl.$^5$ .............................. H05K 3/02
[52] U.S. Cl. ...................... 29/846; 29/825; 156/659.1
[58] Field of Search ............. 156/659.1; 29/825, 846

[56] References Cited

U.S. PATENT DOCUMENTS 4,952,272  8/1990  Okino et al.
5,030,318  7/1991  Reche .................. 156/659.1 X

FOREIGN PATENT DOCUMENTS 61-80067  4/1985  Japan.

OTHER PUBLICATIONS

IBM Technical Disclosure Bull vol. 24, No. 7A, Dec. 1981, pp. 3342-3344.

Primary Examiner—Carl J. Arbes
Attorney, Agent, or Firm—Antonelli, Terry, Stout & Kraus

[57] ABSTRACT

The present invention relates to a manufacturing method of a probe head for an inspection apparatus of a semiconductor device represented by an LSI, and more particularly to a manufacturing method suitable for forming probes with high accuracy in forming into multipins at high density, and is characterized in that a structure is obtained, in which a probe forming conductive lower layer is formed on a formed conductive attaching layer for improving attaching strength after forming electrode pads on a wiring substrate, a mask pattern for forming a probe tip forming conductive upper layer is formed at a position corresponding to the probe position is removed by etching in a cylindrical form until the probe forming conductive lower layer is exposed, a probe tip forming conductive upper layer is grown at the position where etching removal has been performed, a mask pattern is removed, a mask pattern which covers a probe tip forming conductive upper layer is formed thereafter at a position corresponding to the probe position, and the probe forming conductive lower layer is removed by etching in a cylindrical form until the conductive attaching layer is exposed, and pin tips are formed as the small probe tip forming conductive upper layer, thus processing into a pin configuration by removing the conductive attaching layer and the mask.

27 Claims, 4 Drawing Sheets

F I G. 2A
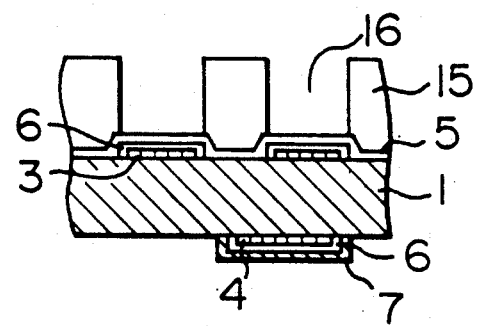
F I G. 2B
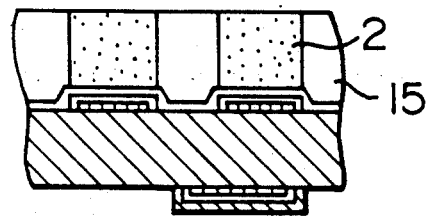
F I G. 2C
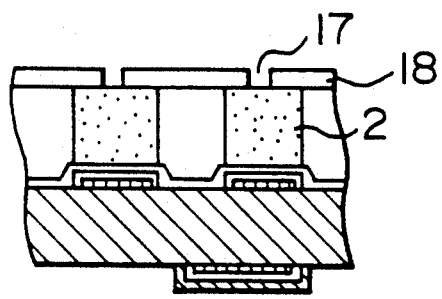
F I G. 2D
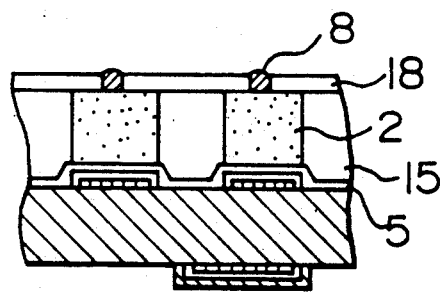
F I G. 2E
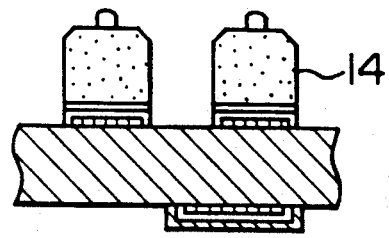

MANUFACTURING METHOD OF A PROBE HEAD FOR SEMICONDUCTOR LSI INSPECTION APPARATUS

BACKGROUND OF THE INVENTION

The present invention relates to a manufacturing method of a probe head for an inspection apparatus of semiconductor devices represented by an LSI, and more particularly to a preferred manufacturing method for forming probes with high accuracy in forming multipins at high density and a semiconductor LSI inspection apparatus using the same.

As a probe head which comes in contact with electrode pads of a semiconductor LSI so as to transmit an electric signal to an inspection apparatus, a conventional apparatus has such a structure that probes prepared beforehand are inserted individually into through holes provided in a probe head structural body in order to form test probes for instance. Further, a probe tip is required to be sharpened in order to improve electrical contact characteristic, and, after the probe is attached fixedly to the probe head structural body, a flat surface is obtained by cutting and polishing and the tip is formed by electron discharge method in a semi-spherical form or a conical form. Besides, an apparatus disclosed in JP-A-61-80067 may be mentioned as a related apparatus of this type.

In the prior art described above, no consideration has been given in point of forming probes into multipins at high density, and there have been technical problems to be solved in points of assembly performance of the probes and forming probe tips with high accuracy. To be more precise, since probes are inserted individually into a probe head structural body having through-holes for assembly in the prior art, highly accurate insertion assembly technique is required for forming probes at high density and into multipins, thus setting a certain limit. Furthermore, it is required to make positions in a height direction and in a transverse direction uniform with high accuracy in a certain area (one chip portion) for securing contact resistance characteristic between pins and pads in a state of no spring performance for the inserted probe tips, particularly in case of tips in contact with electrode pads (solder bumps) of a semiconductor wafer. Further, probe tips are formed by electron discharge method in a prior art, but no consideration is given particularly to the necessity of forming positions of tips with high accuracy.

SUMMARY OF THE INVENTION

It is an object of the present invention which has been made to solve above-described problems to provide a manufacturing method of a probe head in which pin assembly performance of a probe head portion is improved and highly reliable and highly accurate pin setup is realized.

Above-described object in forming multipins at high density may be achieved by forming a probe forming conductive lower layer on a formed conductive attaching layer for improving attaching strength after forming electrode pads on a wiring substrate, a mask pattern for forming a probe tip forming conductive upper layer at a position corresponding to the probe position thereof, which is removed in a cylindrical form by etching until the probe forming conductive lower layer is exposed, the probe tip forming conductive upper layer is grown at the location where removal by etching was performed, after the mask pattern is removed, a mask pattern covering the probe tip forming conductive upper layer is formed at a position corresponding to the probe position, the probe forming conductive lower layer is removed by etching in a cylindrical form until the conductive attaching layer is exposed and the conductive attaching layer and the mask are removed, thereby to obtain a structure in which pin tips are formed as the probe tip forming conductive upper layer, thus working into a pin configuration.

BRIEF DESCRIPTION OF THE DRAWINGS

FIG. 2A thru FIG. 2E are sectional views showing a manufacturing process of forming a multipin probe substrate in another embodiment of the present invention;

DESCRIPTION OF THE PREFERRED EMBODIMENT

Figure 1A:
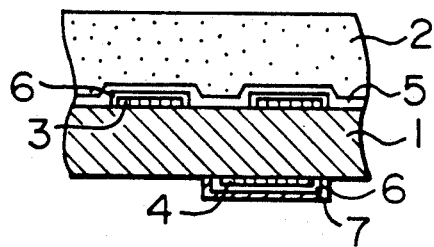
FIG. 1A thru FIG. 1G are sectional views showing a manufacturing process of forming a multipin probe substrate according to an embodiment of the present invention.

Furthermore, the construction of the present invention will be described in detail as follows.

To be more precise, in manufacturing a probe head which transfers an electric signal to an inspection apparatus body by coming in contact with electrode pads of a semiconductor LSI, the present invention is composed of a manufacturing method of a probe head for a semiconductor LSI inspection apparatus, comprising a first process of preparing a multilayer wiring substrate in which a multilayer wiring structural body is packaged inside and electrode pad patterns are provided at predetermined intervals on both sides, a second process of forming by coating a conductive attaching layer for improving attaching strength at need on one surface of the multilayer wiring substrate, a third process of forming a probe forming conductive lower layer on the conductive attaching layer, a fourth process of forming a mask pattern a central axis of which is made to coincide with the electrode pads on the conductive lower layer, a fifth process of forming a probe tip forming conductive upper layer in the mask pattern, a sixth process of removing the mask pattern on the probe forming conductive lower layer, a seventh process of forming a mask pattern which covers the probe tip forming conductive upper layer a central axis of which is made to coincide with the electrode pads on the probe forming conductive lower layer and the probe tip forming conductive upper layer, an eighth process of forming a pin configuration by applying etching to the probe forming conductive lower layer with the mask pattern as a mask, a ninth process of removing by etching the exposed portion of the conductive attaching layer, and a tenth process of removing the mask pattern covering the probe tip forming conductive upper layer.

Further, it is more preferable to add an eleventh process of applying metal plating, which has a corrosion resistance, good conductance and/or high hardness, following to above-described tenth process.

The outline of a representative invention of a semiconductor LSI inspection apparatus disclosed in the present application will be described briefly, as follows.

Namely, the semiconductor LSI inspection apparatus is one composed of a holder which supports a plate-shaped substance to be inspected (a semiconductor wafer) displaceably and a plurality of probes projected on a multilayer wiring substrate disposed opposing to the substance to be inspected which is placed on the holder, in which the substance to be inspected and the probes are brought into contact with each other so as to perform predetermined inspection by displacing the holder relatively to the multilayer wiring substrate, and a piezoelectric actuator which displaces the probes and the substance to be inspected in a direction of approaching relatively to each other at least on one of the multilayer wiring substrate and the holder.

When a pattern which forms a probe tip forming conductive upper layer by means of etching using a desired mask pattern by using a substrate on which a probe forming conductive lower layer on a formed conductive attaching layer for improving attaching strength is formed after forming electrode pads on the wiring substrate, a probe tip forming conductive upper layer is formed using this pattern and, the surface of the conductive upper layer is also flattened at need to a thickness corresponding to a height required for the probes, the mask pattern is removed and the probes are formed collectively thereafter by etching the probe forming conductive lower layer using a desired mask pattern which covers the probe tip forming conductive upper layer, it is possible to improve pin assembly performance of a probe head portion in forming multipins at high density.

Furthermore, by making the surface of the probe tip forming conductive upper layer which becomes a probe tip portion smooth and leaving a very small flat surface at a portion located at the center of the electrode pads, it is possible to put unevenness in a height direction of the pin tip portion at a same level of the smooth surface of the probe tip forming conductive upper layer and to bring the unevenness in a traverse direction to the dimensional accuracy close to that of the mask pattern. Thus, it is possible to realize highly accurate pin setup at the probe head portion.

According to the semiconductor LSI inspection apparatus, the substance to be inspected and the probes are brought into contact with each other through a first step in which a substance to be inspected placed on the holder is made to approach the probes projected above a multilayer wiring substrate to a predetermined distance therefrom by means of displacement of the holder for instance and a second step in which the substance to be inspected and the probes are brought into contact with each other by means of displacement with a piezoelectric actuator, whereby excessive plastic deformation of the substance to be inspected caused by overshooting due to inertia of a holder, a drive system of the holder and the like is avoided as compared with contact operation between the substance to be inspected and the probes by relative movement of the holder only.

In such a manner, it is avoided that an unstable gap is produced between the probes and the substance to be inspected by excessive plastic deformation of the substance to be inspected in coming in contact with the probes so as to make it possible to maintain contact between the substance to be inspected and the probes during inspection stably.

The present invention will be described in the concrete hereafter with reference to an embodiment. FIG. 1A through FIG. 1G show a manufacturing process in sequence of the process for forming multipins on a multilayer wiring substrate 1 which is an embodiment of the present invention.

FIG. 1A shows a state after a process in which a probe forming conductive lower layer 2 is formed on a multilayer wiring substrate 1 having a power supply layer, a signal layer (input/output) and a ground layer. The multilayer wiring substrate 1 is a thick film ceramic substrate, on both sides of which electrode pad portions 3 and 4 made of a tungsten group are formed, and these pads 3 and 4 on both sides are electrically connected with each other through a wiring structural body (not shown). On the electrode pad portion 3, copper is deposited after vacuum deposition of chrome for instance as a conductive attaching layer 5 for improving attaching strength. Further, nickel plating 6 is applied to the electrode pads 3, nickel plating 6 and gold plating 7 are applied to the electrode pad 4. The conductive attaching layer 5 may be formed as occasion demands. The probe forming conductive lower layer 2 having a thickness almost corresponding to the height of the probes is formed by copper plating for instance on the formed conductive attaching layer 5, and the surface was flattened within the flatness of 1 $\mu$m by polishing with diamond abrasive grain so as to form a conductive layer having a thickness of 50 $\mu$m.

Figure 1B:
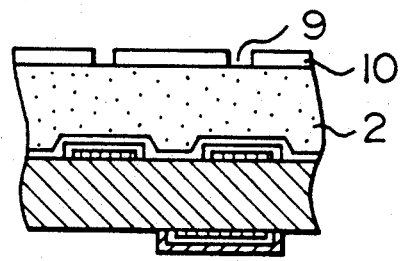

FIG. 1B shows a state after a process of forming a mask pattern 9 for forming a probe tip forming conductive upper layer 8 on the probe forming conductive lower layer 2. The mask pattern 9 is formed by applying a photosensitive polyimide resin layer having the thickness of 20 $\mu$m onto the probe forming conductive lower layer 2, and removing unnecessary portion after exposure and development of a circular pattern for the probe tip forming conductive upper layer 8 on a central axis of the electrode pads for forming the probes.

Figure 1C:
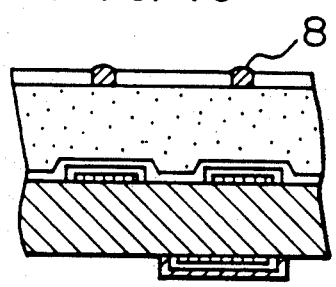

Next, as shown in FIG. 1C, the probe tip forming conductive upper layer 8 is formed by plating. The probe tip forming conductive upper layer 8 is formed so as to bury the mask pattern 9 for forming the probe tips by ordinary electric plating or electroless plating with a conductive material such as nickel, copper or nickel-copper alloy.

Figure 1F:
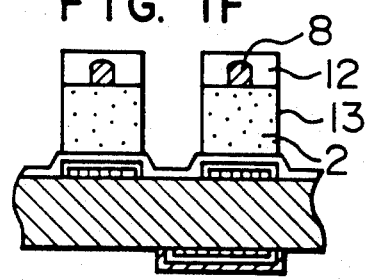
Figure 1D:
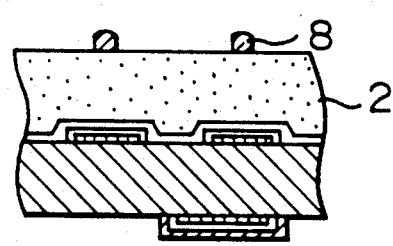

FIG. 1D shows a state after a process in which a polyimide resin mask 10 is removed after forming a probe tip forming conductive upper layer 8 and after flattening the surfaces of the probe tip forming conductive upper layer 8 and the polyimide resin mask 10 by grinder processing, polishing and the like in order to make the height of probes uniform when occasion demands.

Figure 1G:
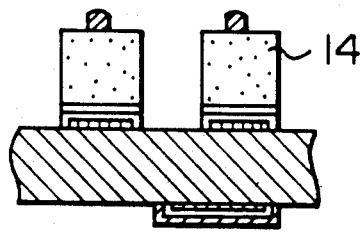
Figure 1E:
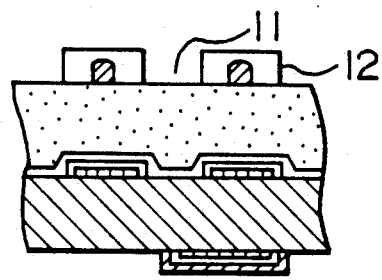

FIG. 1E shows a state after a process in which a mask pattern 11 is formed on the probe forming conductive lower layer 2 so as to cover the probe tip forming conductive upper layer 8. As to the material of the mask pattern 11, a photosensitive polyimide resin layer 12 having the thickness of about 40 $\mu$m is applied onto the probe forming conductive lower layer 2 and unnecessary portions are removed after exposure and development so that circular patterns which cover the probe tip forming conductive upper layer 8 are left on the central axes of the electrode pads for forming the probes, thereby to form a photosensitive polyimide resin layer 12.

FIG. 1F shows a state after terminating etching process of the probe forming conductive lower layer 2. For example, in case copper is used as the probe forming conductive lower layer 2, it is only required to apply shower etching with mixed liquid of cupric chloride and hydrogen peroxide as an etchant. Undercut (also referred to as side etching and side corrosion) is utilized positively by controlling etching conditions, and it is possible to remove the probe forming conductive lower layer 2 leaving the vicinity of the electrode pads 3 so as to obtain a desired configuration. As a result, an etching surface 13 is formed in a state that the mask 12 is left behind.

Furthermore, as shown in FIG. 1G, electric separation is performed by removing the exposed portion of the conductive attaching layer 5 by means of electrolytic etching after removing the mask 12 at unnecessary portions, thereby to form probes 14 each having a very small tip portion.

Besides, it is possible to stabilize and improve electric contact characteristics by forming a plating membrane of gold or rhodium on the surfaces of the probes 14 thereafter.

When copper is used as the probe forming conductive lower layer 2, after plating the surface with a metal having higher hardness than copper such as nickel (Ni) or performing surface treatment such as sputtering and vapor deposition after applying etching processing until the configuration of the probes 14 is obtained, alloying is performed by quenching, thus making it possible to form the probes having high hardness. Furthermore, molybdenum (Mo), titanium (Ti), chrome (Cr), tantalum (Ta), niobium (Nb), copper (Cu)-berylium (Be) group alloy and copper base material a surface of which is plated with a metal of harder quality than copper may be used as the material of the probes 14.

According to the present embodiment, probes at the pitch of 0.2 mm in the electrode pads 3 each having the height of 0.07 mm and the diameter of 0.1 mm at the lower part of the probe can be manufactured at the density of 2,500 pins/10 mm$^2$. Further, accuracy within $\pm 10$ $\mu$m can be achieved as the accuracy of the height of the probe. Furthermore, it is possible to attain the ratio of the height to the width of the probe at 1:1 and the pitch at the electrode pads 3 up to 50 $\mu$m easily in the present embodiment. When it is assumed that the probe height is h and the pitch between electrode pads is d, a probe which satisfies h=0.3 to 5d can be formed easily according to the present embodiment.

FIG. 2A thru FIG. 2E show an embodiment of another forming method for forming the probes 14 shown in FIG. 1G.

FIG. 2A shows a state after a process, following to a process of forming the conductive attaching layer 5 for improving attaching strength on the electrode pads 3 formed on the surface of above-described multilayer wiring substrate 1, in which a photosensitive polyimide resin layer 15 having the thickness almost corresponding to the height required for the probes is formed on the conductive attaching layer 5, and circular patterns for forming the probe forming conductive lower layer 2 have been formed on the central axes of the electrode pads 3 for forming the probes by removing unnecessary portions after exposure and development of the photosensitive polyimide resin layer 15. The thickness of the photosensitive polyimide resin layer 15 was set at 60 $\mu$m in this case.

Next, as shown in FIG. 2B, the probe forming conductive lower layer 2 is formed by plating, and the surfaces of the probe forming conductive lower layer 2 and the photosensitive polyimide resin layer 15 are flattened by polishing in order to make the height of the probes constant at need. Here, the probe forming conductive lower layer 2 was formed so as to bury a mask pattern 16 by ordinary electric plating with nickel or copper, and polishing was performed for flattening within 1 $\mu$m with diamond abrasive grain, thereby to form a conductive layer having the thickness of 50 $\mu$m.

FIG. 2C shows a state after a process in which a mask pattern 17 for forming the probe tip forming conductive upper layer 8 has been formed on the probe forming conductive lower layer 2. The mask pattern 17 is formed by applying a photosensitive polyimide resin layer 18 having the thickness of 20 $\mu$m onto the probe forming conductive lower layer 2 and removing unnecessary portions after exposure and development of circular patterns for the probe tip forming conductive upper layer 8 on the central axes of the electrode pads for forming the probes.

FIG. 2D shows a state after a process in which, after forming the probe tip forming conductive upper layer 8 by plating, the surfaces of the probe tip forming conductive upper layer 8 and a polyimide resin mask 18 are flattened by grinder processing or polishing and the like in order to make the height of the probes constant at need. The probe tip forming conductive upper layer 8 is formed so as to bury the mask pattern 17 for forming the probe tips by means of ordinary electric plating or electroless plating with a conductive material such as nickel, copper or nickel-copper alloy.

Furthermore, as shown in FIG. 2E, the exposed portion of the conductive attaching layer 5 is removed by electrolytic etching after removing the polyimide resin layers 18 and 15, thereby to perform electrical separation and to form probes 14 each having a very small tip portion.

Besides, surface treatment of the probes 14 may be executed thereafter as described with reference to FIG. 1.

Figure 3:
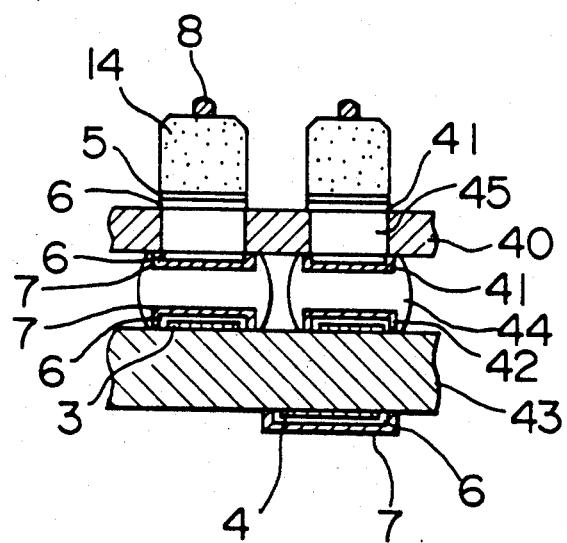
FIG. 3 is a sectional view showing another embodiment for forming a multipin probe substrate according to the present invention.

FIG. 3 shows an embodiment in which a through-hole substrate is used as a wiring substrate for forming the probes and the substrate is connected with a multi-layer wiring substrate.

A multipin forming substrate in one body may be formed in such a manner that, after performing flattening treatment by means of a grinder or polishing with diamond abrasive grain at need on both sides of a through-hole substrate 40 in which inside and outside thereof are interconnected electrically between electrode pads having the same pattern by way of through-holes 45 as a wiring substrate for forming the probes at positions corresponding to electrodes of a semiconductor LSI which is an object to be inspected, electrode pads 41 are formed by applying Ni plating or Au plating at need, a manufacturing process for forming multipins shown in FIG. 1A thru FIG. 1G or FIG. 2A thru FIG. 2E is executed on the surface of the through-hole substrate 40, and the underside of the through-hole substrate 40 on which the multipins have been formed is connected with a multilayer wiring substrate 43 having electrodes 42 for solder bump connection at positions corresponding to the electrode pattern of the through-hole substrate 40 by means of solder bumps 44.

With such arrangement, it is possible for the through-hole substrate 40 to limit the required area only to the multipin forming portion so as to make that area small as compared with the multilayer wiring substrate 43. Therefore, it is possible to secure flatness of the surface easily. Further, it is possible to replace the probes simply and inexpensively by replacing the through-hole 40 only by melting the solder bumps 44.

Figure 4:
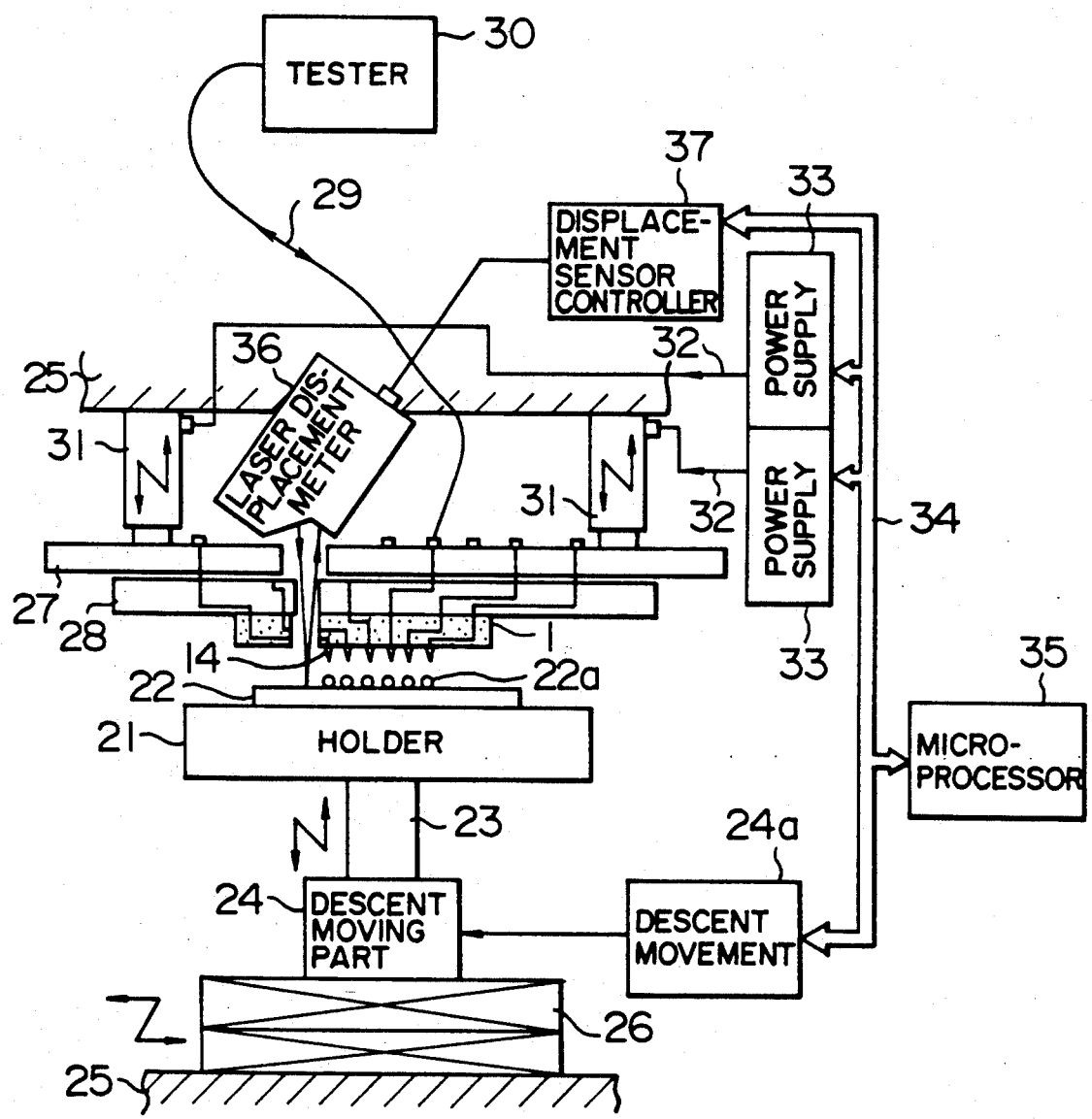
FIG. 4 shows a construction of a semiconductor LSI inspection apparatus according to the present invention.

FIG. 4 is an explanatory view showing a principal part of an inspection apparatus which is an embodiment using probes according to the present invention. In the present embodiment, the inspection apparatus is constructed as a wafer prober in manufacturing of semiconductor devices.

Namely, a semiconductor wafer 22 (a substance to be inspected) is placed detachably on a holder 21 provided almost horizontally. A plurality of solder bumps 22a are formed as external connecting electrodes on the surface of the semiconductor wafer 22. The holder 21 is supported by an ascent and descent moving part 24 composed of a stepping motor for instance through a perpendicular shaft 23 of ascent and descent movement, and the ascent and descent moving part 24 is fixed onto an X-Y stage 26 supported by a main frame 25. Then, positioning operation of the holder 21 in horizontal and vertical directions is performed by combining movement operation of the X-Y stage 26 in a horizontal plane, vertical movement by the ascent and descent moving part 24 and so on with one another. Further, a rotary mechanism not shown is provided on the holder 21, thus making rotary displacement of the holder 21 in a horizontal plane possible.

A base 27 is provided above the holder 21 in a position opposing in parallel to the holder 21, and a probe card 28 and a multilayer wiring substrate 1 are fixed horizontally on a surface of the base 27 opposing to the holder 21. Above-described probes 14 which are arranged at predetermined pitches so as to coincide with respective plurality of solder bumps 22a formed on the semiconductor wafer 22 are formed facing downward perpendicularly on the multilayer wiring substrate 1, and respective probes 14 are connected with a tester 30 through a cable 29 which is connected with the probe card 28 connected with the multilayer wiring substrate 1. In this case, a plurality of piezoelectric actuators 31 such as piezo elements are interposed between the base 27 supporting the probe card 28 and the main frame 25 on the upper side of the base 27, and a plurality of power supplies 33 for moving units are connected with respective piezoelectric actuators 31 through a plurality of cables 32. The piezoelectric actuator 31 stretches itself for approximately 10 to 100 m in a longitudinal direction by applying a voltage at approximately 10 to 1,000 V for instance in proportion to the relevant voltage. Further, it is constructed so that jogging operation of the probes 14 formed on the multilayer wiring substrate 1 in a vertical direction is realized without producing overshooting and the like by distortion in a direction of vertical telescopic motion generated in the piezoelectric actuators 31 in accordance with the voltage applied to the piezoelectric actuators 31 from the power supplies 33 for moving units.

A plurality of power supplies 33 for moving units are connected with a microprocessor 35 through a control bus 34, and are controlled collectively by means of the microprocessor 35. Similarly, a controller of 20 ascent and descent movement 24a which controls the operation of above-described ascent and descent moving part 24 is connected with the microprocessor 35 through the control bus 34, thus making it possible to have vertical movement of the holder 21 by the ascent and descent moving part 24 and jogging operation in a vertical direction of the multilayer wiring substrate 1 on the holder 21 by means of the piezoelectric actuators 31 performed in cooperation with each other.

Incidentally, it is possible, as means of detecting moving quantity in the vertical direction of the probes, to have accurate ascent and descent movement performed through control by feeding back positional information of the holder 21 by means of a laser displacement meter 36 which detects the position of the substance to be inspected by detecting optical path variation of laser light reflected by the substance to be inspected (solder bumps 22a or the surface of the wafer 22) itself or the vicinity thereof to a moving mechanism of the holder 21 through the control bus 34 connected with a displacement sensor controller 37.

Operation and effect of the present embodiment will be described hereafter.

The semiconductor wafer 22 is fixed on the holder 21, and solder bumps 22a formed on the semiconductor conductor wafer 22 are adjusted to be positioned right under the probes 14 formed on the multilayer wiring substrate 1 using the X-Y stage 26 and a rotary mechanism. Thereafter, the ascent and descent moving part 24 is operated through the controller of ascent and descent movement 24a so as to have the holder 21 ascend to a predetermined height, thereby to have tips of the probes 14 of the multilayer wiring substrate 1 and the solder bumps 22a of the semiconductor wafer 22 placed on the holder 21 approach to reach a predetermined distance in contact or non-contact state (a first step).

In the next place, by applying a voltage up to a predetermined value gradually to a plurality of piezoelectric actuators 31 from each of a plurality of power supplies 33 for moving units, individual piezoelectric actuator 31 is elongated by a predetermined quantity, the multilayer wiring substrate 1 is made to descend by a predetermined distance to the holder 21 while keeping a position which is in parallel to the holder 21, and respective tips of a plurality of probes 14 formed on the multilayer wiring substrate 1 are made to stick surely in each of a plurality of solder bumps 22a in the objective semiconductor element by a predetermined quantity, thus producing a state in which individual probe 14 and the solder bump 22a are surely connected electrically with each other (a second step).

Transfer of operating electric power, operation test signal and the like are performed in this state between semiconductor elements formed on the semiconductor wafer 22 and the tester 30 through the cable 29, a plurality of probes 14 and the like, thus determining the quality, etc. of operation characteristics of the semiconductor elements. Above-described series of operations are executed on each of a plurality of semiconductor elements formed on the semiconductor wafer 22, thereby to determine the quality, etc. of operation characteristics.

As a result, by performing inspection of a semiconductor wafer by above-described series of operations using a probe head having very small dispersion in a height direction at the probe tips, it is avoided that an unstable gap is produced between the probes 14 and the solder bumps 22a by excessive plastic deformation of the solder bumps 22a caused by overshooting due to the inertia of the holder 21, the moving system of the holder and the like, thus making it possible to realize an inspection apparatus in which contact between the solder bumps 22a and the probes 14 during inspection may be maintained stably.

As described above, according to the present invention, an effect of improving assembly performance of pin setup by a large margin since it is possible to form multipins collectively at high density and with high quality at the electrode pads of the wiring substrate in forming probes into multipins at high density.

Furthermore, it is possible to put the dispersion in a height direction of the pin tips at a same level as the surface of the probe tip forming conductive upper layer and to set the dispersion in a traverse direction to a level close to dimensional accuracy of the mask pattern. Thus, an effect of improving positional accuracy of the pin tips at the probe head portion by a large margin is obtainable.

We claim:

1. A manufacturing method of a probe head for a semiconductor LSI inspection apparatus which transmits an electric signal to an inspection apparatus body by coming in contact with electrode pads of a semiconductor LSI, the probe head having probes, comprising the steps of:
    providing a wiring substrate in which electrode pads for forming probes are arranged on one surface, electrode pads for transmitting an electric signal between the inspection apparatus and the electrode pads of said LSI are arranged on an underside thereof, and the pads on said both sides are interconnected electrically;
    forming a conductive attaching layer for improving attaching strength on the electrode pads for forming said probes;
    forming a conductive lower layer, having a thickness almost corresponding to a height required for the probes, on said wiring substrate including said conductive attaching layer;
    forming a first mask pattern in which openings in the first mask pattern are aligned on a central axis of electrode pads for forming said probes;
    forming a probe tip-forming conductive upper layer in said first mask pattern;
    removing said first mask pattern on said conductive lower layer;
    forming a second mask pattern which covers both said probe tip-forming conductive upper layer and said conductive lower layer, a central axis of the second mask pattern being made to coincide with that of said electrode pads;
    forming a pin configuration by applying etching to said conductive lower layer with said second mask pattern as a mask, exposing portions of the conductive attaching layer;
    removing the exposed portions of said conductive attaching layer by etching; and
    removing the second mask pattern which covers said probe tip forming conductive upper layer.

2. A manufacturing method of a probe head for a semiconductor LSI inspection apparatus according to claim 1, characterized in that the wiring substrate of said probes is composed of a multilayer wiring substrate having at least three types of wiring layers composed of a power supply layer, a signal input-output layer and a ground layer.

3. A manufacturing method of a probe head for a semiconductor LSI inspection apparatus according to claim 2, characterized in that said multilayer wiring substrate is composed of a ceramic multilayer wiring substrate.

4. A manufacturing method of a probe head for a semiconductor LSI inspection apparatus according to claim 1, characterized by a construction in which a through-hole substrate in which electrode pads on both surfaces are interconnected electrically with through-holes is used as a wiring substrate of said probes, and said through-hole substrate is connected by means of conductive junction material with a multilayer wiring substrate having at least three types of wiring layers composed of a feed layer, a signal input-output layer and a ground layer.

5. A manufacturing method of a probe head for a semiconductor LSI inspection apparatus according to claim 1, including the further step of plating a conductive material on the probes.

6. A manufacturing method of a probe head for a semiconductor LSI inspection apparatus according to claim 5, wherein said step of plating a conductive material is performed after removing the second mask pattern.

7. A manufacturing method of a probe head for a semiconductor LSI inspection apparatus according to claim 5, wherein said conductive material is a metal.

8. A manufacturing method of a probe head for a semiconductor LSI inspection apparatus according to claim 5, wherein said conductive material is anti-corrosive.

9. A manufacturing method of a probe head for a semiconductor LSI inspection apparatus according to claim 5, wherein said conductive material has a greater hardness than that of material of the conductive lower layer.

10. A manufacturing method of a probe head for a semiconductor LSI inspection apparatus according to claim 1, wherein, after forming the conductive lower layer, an upper surface thereof is flattened.

11. A manufacturing method of a probe head for a semiconductor LSI inspection apparatus according to claim 1, wherein, after forming the probe tip-forming conductive upper layer, a surface thereof is flattened to provide a thickness of the probe tip-forming conductive upper layer such that the probe has a desired height.

12. A manufacturing method of a probe head for a semiconductor LSI inspection apparatus according to claim 1, characterized in that said conductive lower layer is composed of a metal selected from the group consisting of nickel (Ni), copper (Cu), copper (Cu)-nickel (Ni) alloy, tungsten (W), molybdenum (Mo), titanium (Ti), chromium (Cr), tantalum (Ta), niobium (Nb) and beryllium (Be)-copper (Cu) alloy, and is formed by a film forming method of vapor deposition, plating, CVD or sputtering.

13. A manufacturing method of a probe head for a semiconductor LSI inspection apparatus according to claim 1, wherein the probe tip-forming upper conductive layer is formed by plating.

14. A manufacturing method of a probe head for a semiconductor LSI inspection apparatus according to claim 5, further comprising a step of sintering the plated conductive material.

15. A manufacturing method of a probe head for a semiconductor LSI inspection apparatus which transmits an electric signal to an inspection apparatus body by coming in contact with electrode pads of a semiconductor LSI, the probe head having probes, comprising the steps of:

providing a wiring substrate in which electrode pads for forming probes are arranged on one surface, electrode pads for transmitting an electric signal between the inspection apparatus and the electrode pads of said LSI are arranged on an underside thereof, and the pads on said both sides are interconnected electrically;

forming a conductive attaching layer for improving attaching strength on the electrode pads for forming said probes;

forming a first mask pattern in which openings in the first mask pattern are aligned on a central axis of electrode pads for forming said probes, said first mask pattern being formed in a thickness almost corresponding to a height required for the probes and being formed on said wiring substrate including said conductive attaching layer for improving attaching strength;

forming a probe-forming conductive lower layer using said first mask pattern as a mask, the conductive lower layer having a height almost corresponding to a height required for the probes;

forming a second mask pattern for forming a probe tip-forming conductive upper layer, which is smaller than said probe-forming conductive lower layer, on said probe-forming conductive lower layer, the second mask pattern having openings exposing the conductive lower layer;

forming a probe tip-forming conductive upper layer on said probe-forming conductive lower layer with said second mask pattern as a mask;

removing said first and second mask patterns; and removing said conductive attaching layer by etching.

16. A manufacturing method of a probe head for a semiconductor LSI inspection apparatus according to claim 15, characterized in that the wiring substrate of said probes is composed of a multilayer wiring substrate having at least three types of wiring layers composed of a power supply layer, a signal input-output layer and a ground layer.

17. A manufacturing method of a probe head for a semiconductor LSI inspection apparatus according to claim 16, characterized in that said multilayer wiring substrate is composed of a ceramic multilayer wiring substrate.

18. A manufacturing method of a probe head for a semiconductor LSI inspection apparatus according to claim 15, characterized by a construction in which a through-hole substrate in which electrode pads on both surfaces are interconnected electrically with through-holes is used as a wiring substrate of said probes, and said through-hole substrate is connected by means of conductive junction material with a multilayer wiring substrate having at least three types of wiring layers composed of a feed layer, a signal input-output layer and a ground layer.

19. A manufacturing method of a probe head for a semiconductor LSI inspection apparatus according to claim 15, including the further step of plating a conductive material on the probes.

20. A manufacturing method of a probe head for a semiconductor LSI inspection apparatus according to claim 19, wherein the step of plating the conductive material is performed after removing the second mask pattern.

21. A manufacturing method of a probe head for a semiconductor LSI inspection apparatus according to claim 19, wherein said conductive material is a metal.

22. A manufacturing method of a probe head for a semiconductor LSI inspection apparatus according to claim 19, wherein said conductive material is anti-corrosive.

23. A manufacturing method of a probe head for a semiconductor LSI inspection apparatus according to claim 19, wherein said conductive material has a greater hardness than that of material of the conductive lower layer.

24. A manufacturing method of a probe head for a semiconductor LSI inspection apparatus according to claim 15, wherein, after forming the conductive lower layer, a surface thereof is flattened so as to provide a thickness of the conductive lower layer such that the probes can have a desired height.

25. A manufacturing method of a probe head for a semiconductor LSI inspection apparatus according to claim 15, wherein, after forming the conductive upper layer, a surface thereof is flattened so as to provide probes having a desired height.

26. A manufacturing method of a probe head for a semiconductor LSI inspection apparatus according to claim 19, further comprising a step of sintering the plated conductive material.

27. A manufacturing method of a probe head for a semiconductor LSI inspection apparatus according to claim 12, characterized in that said probe-forming conductive lower layer is composed of a metal selected from the group consisting of nickel (Ni), copper (Cu), copper (Cu)-nickel (Ni) alloy, tungsten (W), molybdenum (Mo), titanium (Ti), chromium (Cr), tantalum (Ta), niobium (Nb) and beryllium (Be)-copper (Cu) alloy, and is formed by a film forming method of vapor deposition, plating, CVD or sputtering.

* * * * *